United States Patent
Yang (10) Patent No.: US 11,205,693 B2
(45) Date of Patent: Dec. 21, 2021

(54) FAN-OUT WIRING STRUCTURE OF DISPLAY PANEL AND DISPLAY PANEL

(71) Applicant: Wuhan China Star Optoelectronics Semiconductor Display Technology Co., Ltd., Hubei (CN)

(72) Inventor: Hanning Yang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 260 days.

(21) Appl. No.: 16/603,783

(22) PCT Filed: Feb. 26, 2019

(86) PCT No.: PCT/CN2019/076108
§ 371 (c)(1),
(2) Date: Oct. 8, 2019

(87) PCT Pub. No.: WO2020/118906
PCT Pub. Date: Jun. 18, 2020

(65) Prior Publication Data
US 2021/0335977 A1    Oct. 28, 2021

(30) Foreign Application Priority Data
Dec. 14, 2018  (CN) .......................... 201811531658.X (51) Int. Cl.
*H01L 27/32* (2006.01)
*H01L 51/10* (2006.01)
*H01L 51/52* (2006.01)

(52) U.S. Cl.
CPC ........ *H01L 27/3276* (2013.01); *H01L 51/102* (2013.01); *H01L 51/5203* (2013.01); *G09G 2300/0426* (2013.01); *G09G 2380/02* (2013.01)

(58) Field of Classification Search
CPC ............. H01L 27/3297; H01L 27/3288; H01L 27/3276; H01L 51/102; H01L 51/5203;
(Continued)

(56) References Cited

U.S. PATENT DOCUMENTS

2016/0307990 A1* 10/2016 Kwon ................. H01L 27/1255
2018/0013095 A1   1/2018 Choi et al.
(Continued)

FOREIGN PATENT DOCUMENTS

| CN | 107994055 A | 5/2018 |
|----|-------------|--------|
| CN | 108091612 A | 5/2018 |
| CN | 108461531 A | 8/2018 |

*Primary Examiner* — Scott B Geyer
(74) *Attorney, Agent, or Firm* — Taft Stettinius & Hollister LLP (57) ABSTRACT

A fan-out wiring structure of a display panel is configured to electrically connect a signal transmission interface of a driving circuit to a signal receiving interface of a display area of the display panel. The fan-out wiring structure includes a first wiring layer and a second wiring layer. The first and the second wiring layers both define an extending area, a connecting area, and a bent area disposed between the extending area and the connecting area. The extending area and the connecting area of the first wiring layer each have a plurality of metal wires, and the bent area of the first wiring layer has a plurality of flexible wires. Each of the flexible wires is made of an organic electrically conductive material, and opposite ends of each of the flexible wires are connected to corresponding metal wires in the extending area and the connecting area, respectively.

14 Claims, 6 Drawing Sheets

(58) Field of Classification Search
CPC ........ H01L 51/0037; G09G 2300/0426; G09G 2380/02
See application file for complete search history.

(56) References Cited

U.S. PATENT DOCUMENTS

| | | | |
|---|---|---|---|
| 2018/0197484 A1* | 7/2018 | Moon | ................. H01L 27/1248 |
| 2019/0012031 A1* | 1/2019 | Kim | .................... H01L 51/5203 |
| 2019/0148474 A1 | 5/2019 | Bu | |
| 2019/0181154 A1 | 6/2019 | Xia | |

* cited by examiner

FAN-OUT WIRING STRUCTURE OF DISPLAY PANEL AND DISPLAY PANEL

CROSS-REFERENCE TO RELATED APPLICATIONS

This application is a U.S. National Phase of International PCT Application No. PCT/CN2019/076108 filed Feb. 26, 2019, which claims the benefit of Chinese Patent Application Serial No. 201811531658.X filed Dec. 14, 2018, the contents of each application are incorporated herein by reference in their entirety.

BACKGROUND OF INVENTION

1. Field of Invention

The present invention relates to a display field, and particularly, to a fan-out wiring structure of a display panel and a display panel.

2. Related Art

Figure 1:
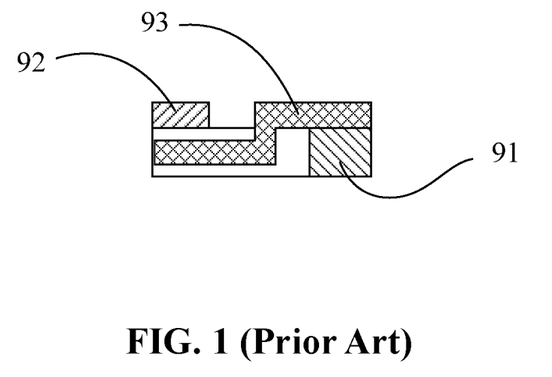
FIG. 1 is a schematic view of a conventional fan-out wiring structure.

With development of display technology, the demand for high-screen ratio displays is getting higher and higher, so borders around displays are getting narrower and smaller. Increasing a screen ratio by a method of pad bending becomes an effective technical means. In order to achieve demands of a higher screen ratio, it is needed to reduce a bending radius of a bending area. A smaller bending radius tends to cause source and drain traces in the bent area to be more prone to stress damage and fractures, resulting in ineffectiveness of display areas of panels. As shown in FIG. 1, source and drain traces 92 and 93 in a bent area 91 of a current display panel are metal traces of a particular shape prepared through a photolithography process over a deep via layer. Since a thickness of an organic layer on an upper side and a lower side of the metal traces is different, the source and drain traces 92 and 93 are not in a neutral layer in the bent area, so when a substrate is bent, the source and drain traces 92 and 93 are prone to stress damage, and during assembly processes, the source and drain traces 92 and 93 are easily damaged by external forces.

SUMMARY OF INVENTION

An object of the present invention is to provide a fan-out wiring structure of a display panel to increase strain resistance and structural strength of source and drain wirings in a bent area of a substrate of the display panel.

To achieve the above-mentioned object, the present invention provides a fan-out wiring structure of a display panel, configured to electrically connect a signal transmission interface of a driving circuit to a signal receiving interface of a display area of the display pane, the fan-out wiring structure comprising: a first wiring layer and a second wiring layer disposed above the first wiring layer, and the first wiring layer and the second wiring layer both defining an extending area connected to the display area, a connecting area connected to the signal transmission interface, a bent area disposed between the extending area and the connecting area, a substrate layer, and a filling hole formed on the substrate layer, wherein part of the extending area, part of the connecting area, and part of the bent area are all disposed over the filling hole, and wherein the extending area and the connecting area of the first wiring layer each comprise a plurality of metal wires, the bent area of the first wiring layer comprises a plurality of flexible wires, each of the flexible wires is made of an organic electrically conductive material, and opposite ends of each of the flexible wires are connected to corresponding metal wires in the extending area and the connecting area on the filling hole, and are provided with contact portions bending upward and extending towards the corresponding metal wires for increasing a contact range of the flexible wires and the corresponding metal wires.

The present invention further provides a fan-out wiring structure of a display panel, configured to electrically connect a signal transmission interface of a driving circuit to a signal receiving interface of a display area of the display pane, the fan-out wiring structure comprising: a first wiring layer and a second wiring layer disposed above the first wiring layer, and the first wiring layer and the second wiring layer both defining an extending area connected to the display area, a connecting area connected to the signal transmission interface, and a bent area disposed between the extending area and the connecting area, wherein the extending area and the connecting area of the first wiring layer each comprise a plurality of metal wires, the bent area of the first wiring layer comprises a plurality of flexible wires, each of the flexible wires is made of an organic electrically conductive material, and opposite ends of each of the flexible wires are connected to corresponding metal wires in the extending area and the connecting area, respectively.

In a preferable embodiment of the present invention, the second wiring layer comprises at least a wire comprising a main portion and a branch portion, wherein the main portion passes through the bent area from the extending area to extend to the connecting area, the branch portion is disposed and laterally extends in the extending area, and one end of the branch portion far away from the main portion further passes through the bent area to extend in a direction towards the connecting area, wherein parts of the main portion and the branch portion disposed on the bent area are flexible wires made of the organic electrically conductive material, and parts of the main portion and the branch portion disposed on the extending area and the connecting area are metal wires made of metal.

In another preferable embodiment of the present invention, the second wiring layer comprises at least a wire made of metal and comprising a main portion and a branch portion, wherein the main portion passes through the bent area from the extending area to extend to the connecting area, the branch portion is disposed and laterally extends in the extending area, and one end of the branch portion far away from the main portion further passes through the bent area to extend in a direction towards the connecting area.

In another preferable embodiment of the present invention, opposite ends of each of the flexible wires are provided with contact portions bending upward and extending towards the corresponding metal wires for increasing a contact range of the flexible wires and the corresponding metal wires.

In another preferable embodiment of the present invention, the fan-out wiring structure further comprises a substrate layer and a filling hole formed on the substrate layer, wherein part of the extending area, part of the connecting area, and part of the bent area are all disposed over the filling hole, and the flexile wires and the metal wires of the first wiring layer are in contact with each other on the filling hole to be electrically connected.

In another preferable embodiment of the present invention, a first dielectric layer is disposed between a side of the filling hole and the first wiring layer and the substrate layer, and a second dielectric layer is disposed between the first wiring layer and the second wiring layer.

In another preferable embodiment of the present invention, a functional layer and the first dielectric layer located on the functional layer are disposed between another side of the filling hole and the first wiring layer, wherein the functional layer comprises a barrier layer disposed on the substrate layer, a buffer layer disposed on the barrier layer, and a gate insulating layer disposed on the buffer layer.

In another preferable embodiment of the present invention, the organic electrically conductive material is a self-conducting organic material, comprising small molecules, macromolecules, and polymer materials.

In another preferable embodiment of the present invention, the organic electrically conductive material is an organic material doped with conductive particles, wherein the conductive particles include micro-nano conductive materials comprising metal nano-particles and micro-particles, graphene, or carbon nanotubes.

The present invention further provides a display panel, comprising a fan-out wiring structure, using the fan-out wiring structure as described above.

The present invention utilizes the flexible wires made of the organic electrically conductive material in the first wiring layer corresponding to the bent area, or simultaneously utilizes the flexible wires made of the organic electrically conductive material in the second wiring layer corresponding to the bent area, to replace traditional metal wirings, thereby to increase strain resistance and structural strength of wirings in the bent area, and effectively avoid poor displaying resulting from damage or breakage of the source and drain wirings caused by bending or external force.

DESCRIPTION OF PREFERRED EMBODIMENTS

The following embodiments are referring to the accompanying drawings for exemplifying specific implementable embodiments of the present disclosure. Furthermore, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, elements with similar structures are labeled with like reference numerals.

Figure 2:
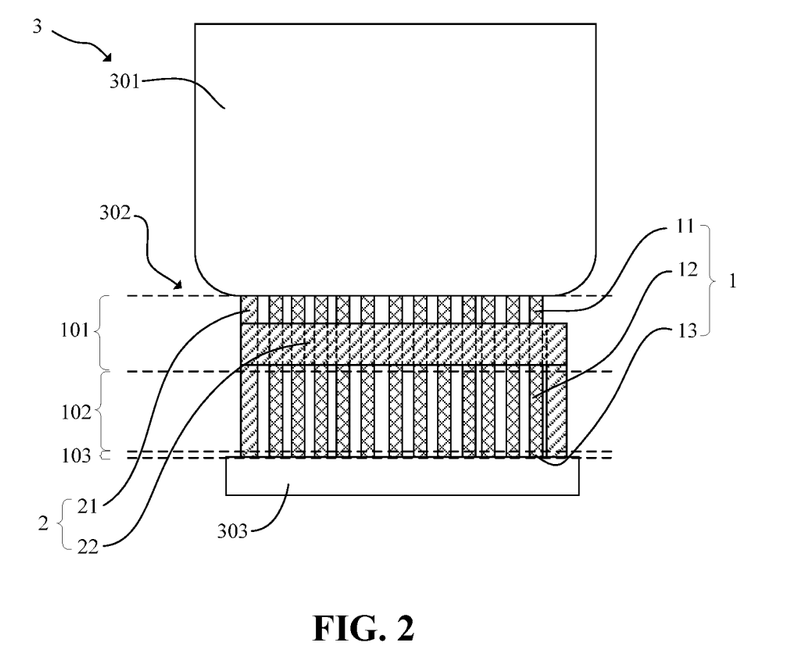
FIG. 2 is a schematic view of a fan-out wiring structure of a display panel in accordance with a preferable embodiment of the present invention.

FIG. 2 is a schematic view of a fan-out wiring structure of a display panel in accordance with a preferable embodiment of the present invention. The present invention provides a fan-out wiring structure includes a first wiring layer 1 and a second wiring layer 2 disposed above the first wiring layer 1. The fan-out wiring structure is configured on opposite frame sides of the display panel 3, that is, curving edges at two sides of the display panel 3, wherein the display panel 3 is an organic light emitting display. As shown in FIG. 2, the fan-out wiring structure is disposed on a fan-out area 302 of the display panel 3 and configured to electrically connect a signal transmission interface 303 (i.e., a chip bonding area) of a driving circuit to a signal receiving interface of a display area 301 of the display panel 3.

Please continue referring to FIG. 2. the first wiring layer 1 and the second wiring layer 2 both define an extending area 101 connected to the display area 301, a connecting area 103 connected to the signal transmission interface 303, and a bent area 102 disposed between the extending area 101 and the connecting area 103, wherein the bent area 102 is defined as an area corresponding to a curving portion of a frame of the display panel 3. The first wiring layer 1 includes a plurality of wires, and the second wiring layer 2 includes at least a wire, wherein the plurality of wires of the first wiring layer 1 and the second wiring layer 2 are source wirings and drain wirings of the display panel 3.

As shown in FIG. 2, the extending area 101 of the first wiring layer 1 includes a plurality of metal wires 11, and the connecting area of 103 includes a plurality of metal wires 13, and the bent area 102 includes a plurality of flexible wires 12. Particularly, each of the flexible wires 12 is made of an organic electrically conductive material, and opposite ends of each of the flexible wires 12 are connected to corresponding metal wires 11 and 13 in the extending area 101 and the connecting area 103. In other words, each of the wires of the first wiring layer 1 is made of different materials. In this embodiment, the organic electrically conductive material is a self-conducting organic material, including small molecules, macromolecules, and polymer materials, such as poly (3,4-ethylenedioxythiophene): polystyrene sulfonate (PEDOT: PSS). In another embodiment, the organic electrically conductive material is an organic material doped with conductive particles, wherein the conductive particles include micro-nano conductive materials comprising metal nano-particles and micro-particles, graphene, or carbon nanotubes.

Figure 3:
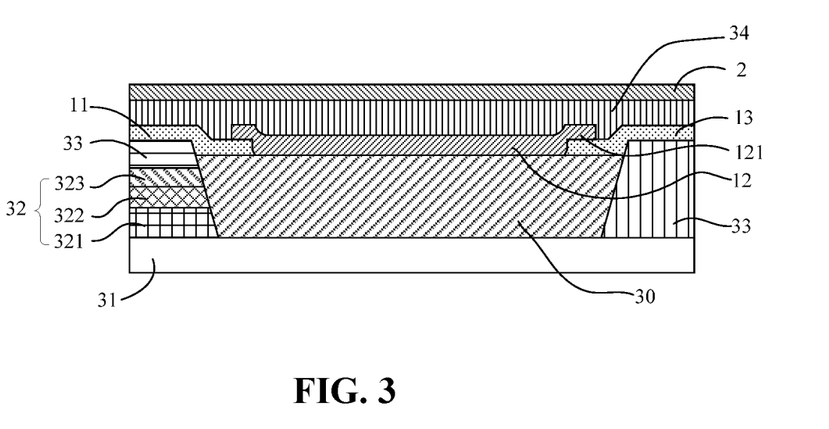
FIG. 3 is a schematic cross-sectional view of the fan-out wiring structure of FIG. 2.

FIG. 3 is a schematic cross-sectional view of the fan-out wiring structure of FIG. 2. As shown in FIG. 3, the fan-out wiring structure of the present invention further includes a substrate layer 31, and a filling hole 30 formed on the substrate layer 31, wherein the substrate layer 31 is made of polyimide, and the filling hole 30 is located corresponding to the curving portion of a frame portion. The filling hole 30 may be deposited with a polymer material or an organic material to enhance bending resistance of the frame portion. As shown in FIG. 3, part of the extending area 101, part of the connecting area 103, and part of the bent area 102 are all disposed over the filling hole 30. The flexible wires 12 and the metal wires 11 and 13 of the first wiring layer 1 are in contact with each other to be electrically connected on the filling hole 30. Specifically, a first dielectric layer 33 is disposed between a side of the filling hole 30 and the first wiring layer 1 and the substrate layer 31, and a second dielectric layer 34 is disposed between the first wiring layer 1 and the second wiring layer 2. Furthermore, as shown in FIG. 3, a functional layer 32 and the first dielectric layer 33 located on the functional layer 32 are disposed between another side of the filling hole 30 and the first wiring layer 1, wherein the functional layer 32 includes a barrier layer 321 disposed on the substrate layer 31, a buffer layer 322 disposed on the barrier layer 321, and a gate insulating layer 323 disposed on the buffer layer 322.

Please continue referring to FIG. 3. opposite ends of each of the flexible wires 12 of the first wiring layer 1 are provided with contact portions 121 bending upward and extending towards the corresponding metal wires 11 and 13 for increasing a contact range of the flexible wires 12 and the corresponding metal wires 11 and 13, thereby ensuring a firmly electrically connection.

Please continue referring to FIG. 2 and FIG. 3. The second wiring layer 2 includes at least a wire made of metal and includes a main portion 21 and a branch portion 22, wherein the main portion 21 passes through the bent area 102 from the extending area 101 to extend to the connecting area 103. The branch portion 22 is disposed and laterally extends in the extending area 101, and one end of the branch portion 22 far away from the main portion 21 further passes through the bent area 102 to extend in a direction towards the connecting area 103, such that the branch portion 22 forms an inverted L shape. In this preferable embodiment, both the main portion 21 and the branch portion 22 are made of a same metal material, that is, the at least a wire of the second wiring layer 2 is made of the same metal material.

Figure 4:
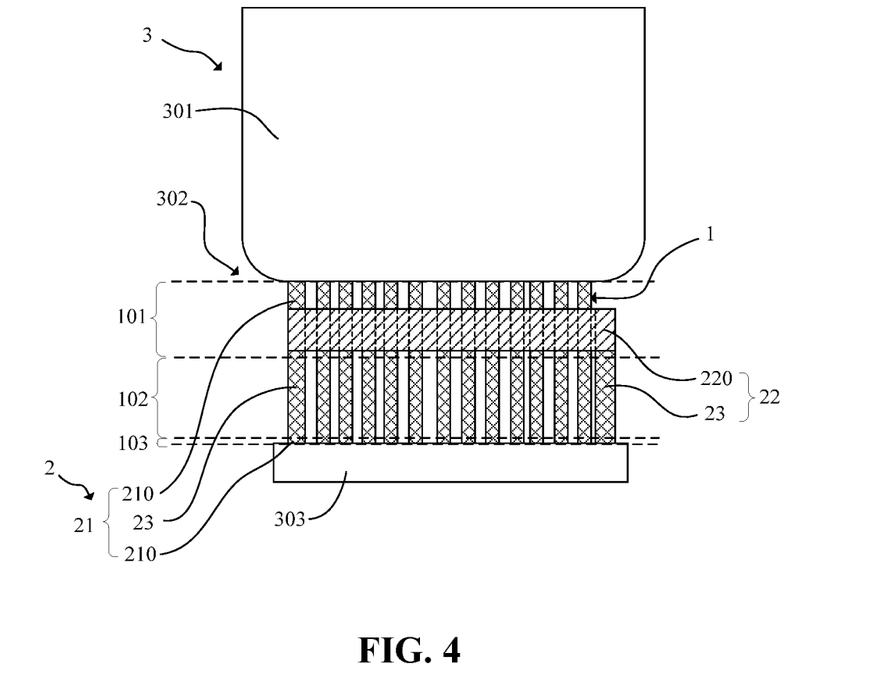
FIG. 4 is a schematic view of a fan-out wiring structure of a display panel in accordance with another preferable embodiment of the present invention.
Figure 5:
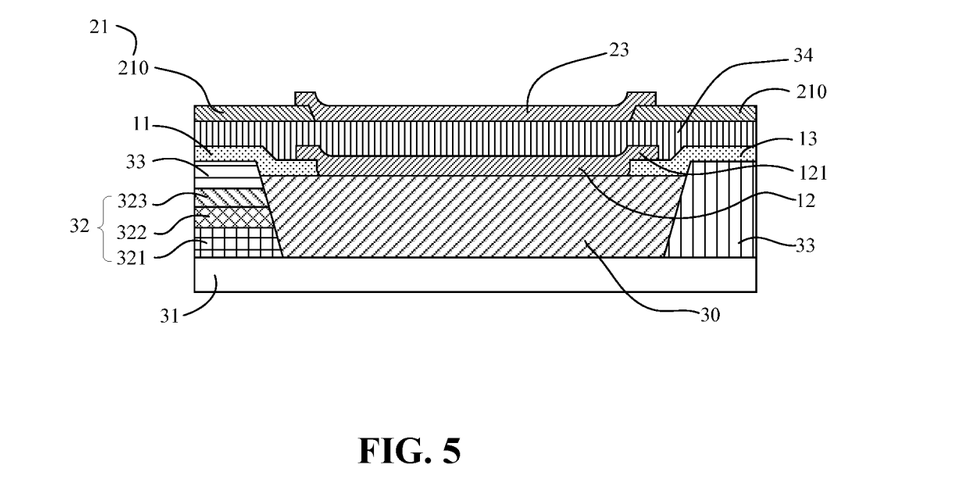
FIG. 5 is a schematic cross-sectional view of the fan-out wiring structure of FIG. 4.

FIG. 4 is a schematic view of a fan-out wiring structure of a display panel in accordance with another preferable embodiment of the present invention. FIG. 5 is a schematic cross-sectional view of the fan-out wiring structure of FIG. 4. The embodiment shown in FIG. 4 and FIG. 5 and the embodiment of FIG. 2 and FIG. 3 have the same structure in most structures, and both include the first wiring layer 1 and the second wiring layer 2 each include the extending area 101, the bent area 102, and the connecting region 103, and other identical structures are not described herein. A main difference between the fan-out wiring structure of FIG. 4 and FIG. 2 is that the second wiring layer 2.

As shown in FIG. 4, the second wiring layer 2 includes the at least a wire including the main portion 21 and the branch portion 22, wherein the main portion 21 passes through the bent area 102 from the extending area 101 to extend to the connecting area 103. The branch portion 22 is disposed and laterally extends in the extending area 101, and one end of the branch portion 22 far away from the main portion 21 further passes through the bent area 102 to extend in a direction towards the connecting area 103 to connect the signal transmission interface 303. Parts of the main portion 21 and the branch portion 22 disposed on the bent area 102 are flexible wires 23 made of an organic electrically conductive material, and parts of the main portion 21 and the branch portion 22 disposed on the extending area 101 and the connecting area 103 are metal wires 210 and 220 made of metal. The flexible wires 23 of the second wiring layer 2 may be made of a material same as the material of the flexible wires 12 of the first wiring layer 1.

The present invention utilizes the flexible wires 12 made of the organic electrically conductive material in the first wiring layer 1 corresponding to the bent area 102, or simultaneously utilizes the flexible wires 23 made of the organic electrically conductive material in the second wiring layer 2 corresponding to the bent area 102, to replace traditional metal wirings, thereby to increase strain resistance and structural strength of wirings in the bent area 102, and effectively avoid poor displaying results from damage or breakage of the source and drain wirings caused by bending or external force.

The present invention further provides a display panel 3 including the fan-out wiring structure as described above, wherein the detailed structure of the fan-out wiring structure has been described in detail in the foregoing embodiments of FIGS. 2 to 5, and thus is not reiterated herein.

Figure 6:
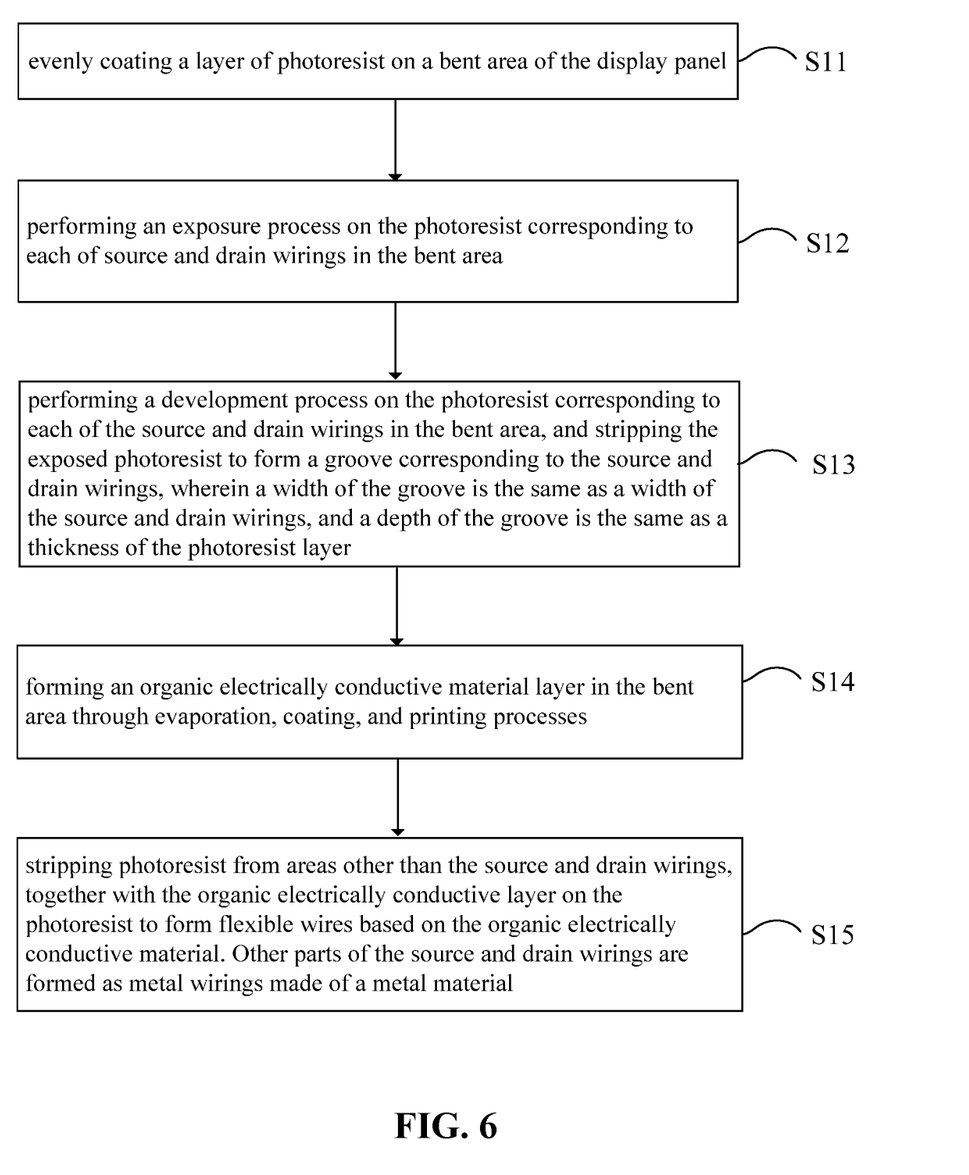
FIG. 6 is a flowchart of manufacturing a fan-out wiring structure of a display panel in accordance with a preferable embodiment of the present invention.

The present invention further provides a method of manufacturing a fan-out wiring structure of a display panel. FIG. 6 is a flowchart of manufacturing a fan-out wiring structure of a display panel in accordance with a preferable embodiment of the present invention, wherein the structure of the fan-out wiring structure has been described in detail in the foregoing embodiments, and thus is not reiterated herein. The method of manufacturing the fan-out wiring structure as shown in FIG. 6 includes following steps. Step S11: evenly coating a layer of photoresist on a bent area of the display panel. Step S12: performing an exposure process on the photoresist corresponding to each of source and drain wirings in the bent area. Step S13: performing a development process on the photoresist corresponding to each of the source and drain wirings in the bent area, and stripping the exposed photoresist to form a groove corresponding to the source and drain wirings, wherein a width of the groove is the same as a width of the source and drain wirings, and a depth of the groove is the same as a thickness of the photoresist layer. Step S14: forming an organic electrically conductive material layer in the bent area through evaporation, coating, and printing processes. Step S15: stripping photoresist from areas other than the source and drain wirings, together with the organic electrically conductive layer on the photoresist to form flexible wires based on the organic electrically conductive material. Other parts of the source and drain wirings are formed as metal wirings made of a metal material. The flexible wires are in contact with tops of source wirings and drain wirings at both a front and a rear in the bent area to fulfill a mutual electrical connection.

Figure 7:
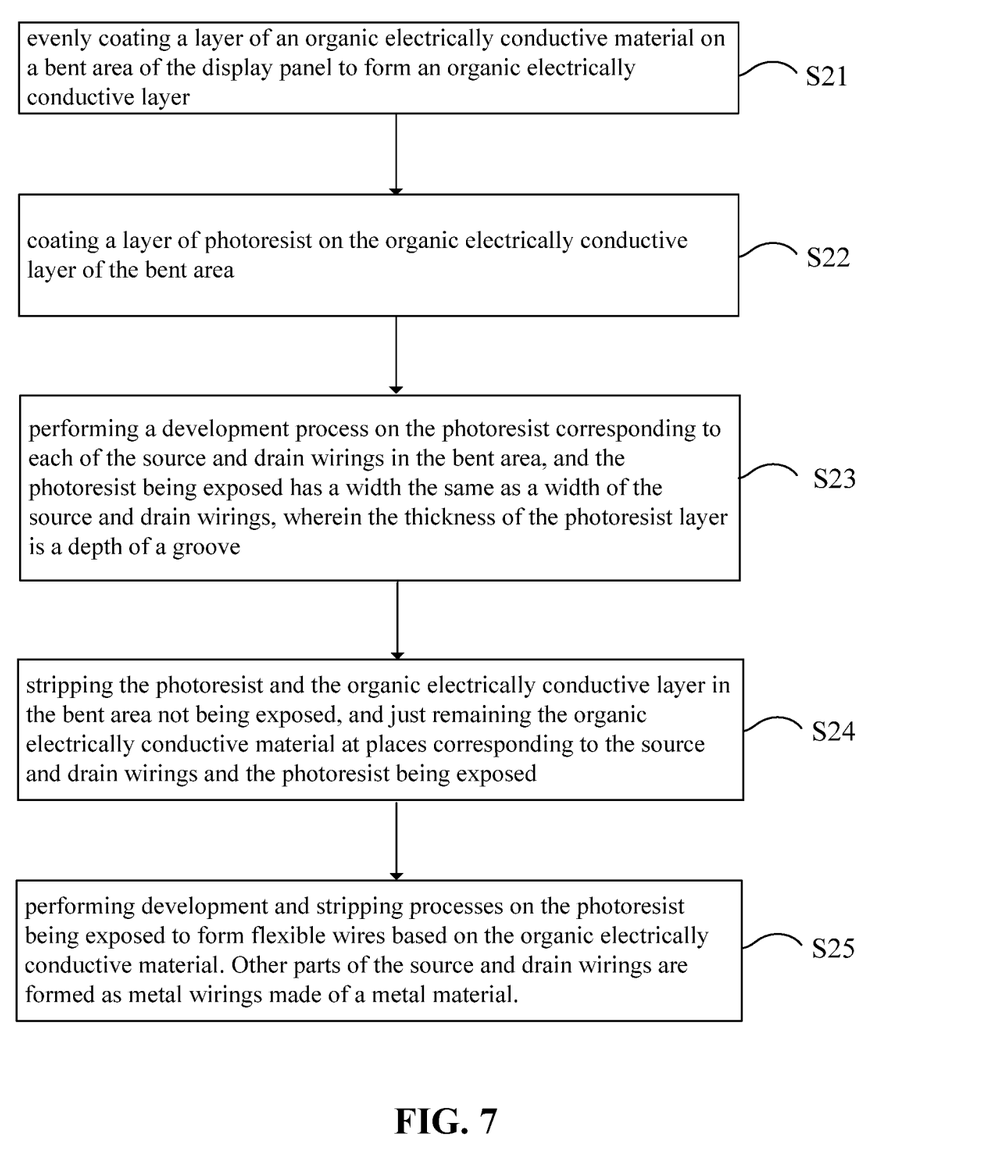
FIG. 7 is a flowchart of manufacturing a fan-out wiring structure of a display panel in accordance with another preferable embodiment of the present invention.

FIG. 7 is a flowchart of manufacturing a fan-out wiring structure of a display panel in accordance with another preferable embodiment of the present invention, wherein the detailed structure of the display panel has been described in detail in the foregoing embodiments, and thus is not reiterated herein. The method of manufacturing the fan-out wiring structure as shown in FIG. 7 includes following steps. Step S21: evenly coating a layer of an organic electrically conductive material on a bent area of the display panel to form an organic electrically conductive layer. Step S22: coating a layer of photoresist on the organic electrically conductive layer of the bent area. Step S23: performing a development process on the photoresist corresponding to each of the source and drain wirings in the bent area, and the photoresist being exposed has a width the same as a width of the source and drain wirings, wherein the thickness of the photoresist layer is a depth of a groove. Step S24: stripping the photoresist and the organic electrically conductive layer in the bent area not being exposed, and just remaining the organic electrically conductive material at places corresponding to the source and drain wirings and the photoresist being exposed. Step S25: performing development and stripping processes on the photoresist being exposed to form flexible wires based on the organic electrically conductive material. Other parts of the source and drain wirings are formed as metal wirings made of a metal material. The flexible wires are in contact with tops of source wirings and drain wirings at both a front and a rear in the bent area to fulfill a mutual electrical connection.

It is understood that the invention may be embodied in other forms within the scope of the claims. Thus the present examples and embodiments are to be considered in all respects as illustrative, and not restrictive, of the invention defined by the claims.

What is claimed is:

1. A fan-out wiring structure of a display panel, configured to electrically connect a signal transmission interface of a driving circuit to a signal receiving interface of a display area of the display panel, the fan-out wiring structure comprising:
a first wiring layer and a second wiring layer disposed above the first wiring layer, and the first wiring layer and the second wiring layer both defining an extending area connected to the display area, a connecting area connected to the signal transmission interface, a bent area disposed between the extending area and the connecting area, a substrate layer, and a filling hole formed on the substrate layer, wherein part of the extending area, part of the connecting area, and part of the bent area are all disposed over the filling hole, and wherein the extending area and the connecting area of the first wiring layer each comprise a plurality of metal wires, the bent area of the first wiring layer comprises a plurality of flexible wires, each of the flexible wires is made of an organic electrically conductive material, and opposite ends of each of the flexible wires are connected to corresponding metal wires in the extending area and the connecting area on the filling hole, and are provided with contact portions bending upward and extending towards the corresponding metal wires for increasing a contact range of the flexible wires and the corresponding metal wires.

2. The fan-out wiring structure of the display panel of claim 1, wherein the second wiring layer comprises at least a wire comprising a main portion and a branch portion, wherein the main portion passes through the bent area from the extending area to extend to the connecting area, the branch portion is disposed and laterally extends in the extending area, and one end of the branch portion far away from the main portion further passes through the bent area to extend in a direction towards the connecting area, wherein parts of the main portion and the branch portion disposed on the bent area are flexible wires made of the organic electrically conductive material, and parts of the main portion and the branch portion disposed on the extending area and the connecting area are metal wires made of metal.

3. The fan-out wiring structure of the display panel of claim 1, wherein the second wiring layer comprises at least a wire made of metal and comprising a main portion and a branch portion, wherein the main portion passes through the bent area from the extending area to extend to the connecting area, the branch portion is disposed and laterally extends in the extending area, and one end of the branch portion far away from the main portion further passes through the bent area to extend in a direction towards the connecting area.

4. The fan-out wiring structure of the display panel of claim 1, wherein the organic electrically conductive material is a self-conducting organic material, comprising small molecules, macromolecules, or polymer materials.

5. A fan-out wiring structure of a display panel, configured to electrically connect a signal transmission interface of a driving circuit to a signal receiving interface of a display area of the display panel, the fan-out wiring structure comprising:
a first wiring layer and a second wiring layer disposed above the first wiring layer, and the first wiring layer and the second wiring layer both defining an extending area connected to the display area, a connecting area connected to the signal transmission interface, and a bent area disposed between the extending area and the connecting area, wherein the extending area and the connecting area of the first wiring layer each comprise a plurality of metal wires, the bent area of the first wiring layer comprises a plurality of flexible wires, each of the flexible wires is made of an organic electrically conductive material, and opposite ends of each of the flexible wires are connected to corresponding metal wires in the extending area and the connecting area, respectively.

6. The fan-out wiring structure of the display panel of claim 5, wherein the second wiring layer comprises at least a wire comprising a main portion and a branch portion, wherein the main portion passes through the bent area from the extending area to extend to the connecting area, the branch portion is disposed and laterally extends in the extending area, and one end of the branch portion far away from the main portion further passes through the bent area to extend in a direction towards the connecting area, wherein parts of the main portion and the branch portion disposed on the bent area are flexible wires made of the organic electrically conductive material, and parts of the main portion and the branch portion disposed on the extending area and the connecting area are metal wires made of metal.

7. The fan-out wiring structure of the display panel of claim 5, wherein the second wiring layer comprises at least a wire made of metal and comprising a main portion and a branch portion, wherein the main portion passes through the bent area from the extending area to extend to the connecting area, the branch portion is disposed and laterally extends in the extending area, and one end of the branch portion far away from the main portion further passes through the bent area to extend in a direction towards the connecting area.

8. The fan-out wiring structure of the display panel of claim 5, wherein opposite ends of each of the flexible wires are provided with contact portions bending upward and extending towards the corresponding metal wires for increasing a contact range of the flexible wires and the corresponding metal wires.

9. The fan-out wiring structure of the display panel of claim 5, further comprises a substrate layer and a filling hole formed on the substrate layer, wherein part of the extending area, part of the connecting area, and part of the bent area are all disposed over the filling hole, and the flexile wires and the metal wires of the first wiring layer are in contact with each other on the filling hole to be electrically connected.

10. The fan-out wiring structure of the display panel of claim 9, wherein a first dielectric layer is disposed between a side of the filling hole and the first wiring layer and the substrate layer, and a second dielectric layer is disposed between the first wiring layer and the second wiring layer.

11. The fan-out wiring structure of the display panel of claim 10, wherein a functional layer and the first dielectric layer located on the functional layer are disposed between another side of the filling hole and the first wiring layer, wherein the functional layer comprises a barrier layer disposed on the substrate layer, a buffer layer disposed on the barrier layer, and a gate insulating layer disposed on the buffer layer.

12. The fan-out wiring structure of the display panel of claim 5, wherein the organic electrically conductive material is a self-conducting organic material, comprising small molecules, macromolecules, or polymer materials.

13. The fan-out wiring structure of the display panel of claim 5, wherein the organic electrically conductive material is an organic material doped with conductive particles, wherein the conductive particles include micro-nano conductive materials comprising metal nano-particles and micro-particles, graphene, or carbon nanotubes.

14. A display panel, comprising the fan-out wiring structure of claim 5.

* * * * *